United States Patent
Hsu et al.

(10) Patent No.: US 11,011,210 B2
(45) Date of Patent: May 18, 2021

(54) MEMORY LAYOUT STRUCTURE

(71) Applicant: UNITED MICROELECTRONICS CORP., Hsin-Chu (TW)

(72) Inventors: Po-Kai Hsu, Tainan (TW); Hung-Yueh Chen, Hsinchu (TW); Kun-I Chou, Tainan (TW); Jing-Yin Jhang, Tainan (TW); Hui-Lin Wang, Taipei (TW); Yu-Ping Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 83 days.

(21) Appl. No.: 16/592,734

(22) Filed: Oct. 3, 2019

(65) Prior Publication Data

US 2021/0065750 A1   Mar. 4, 2021

(30) Foreign Application Priority Data

Sep. 2, 2019 (CN) .......................... 201910822088.8

(51) Int. Cl.
*G11C 5/06* (2006.01)
*H01L 27/24* (2006.01)
*H01L 27/22* (2006.01)

(52) U.S. Cl.
CPC ............ *G11C 5/063* (2013.01); *H01L 27/228* (2013.01); *H01L 27/2463* (2013.01)

(58) Field of Classification Search
CPC .............. H01L 27/228; H01L 27/2463; H01L 27/10–1028; G11C 5/063; G11C 2213/70–82; G11C 5/06–12
See application file for complete search history.

(56) References Cited

U.S. PATENT DOCUMENTS

| 7,046,547 | B2 | 5/2006 | Witcraft |
| 8,865,481 | B2 | 10/2014 | Li |
| 2008/0165567 | A1* | 7/2008 | Rhie ..................... H01L 27/101 365/148 |

* cited by examiner

*Primary Examiner* — Laura M Menz
*Assistant Examiner* — Candice Chan
(74) *Attorney, Agent, or Firm* — Winston Hsu

(57) ABSTRACT

A memory layout structure, which is provided with multiple source lines between active areas, each source line has multiple branches electrically connecting with the active areas at opposite sides in alternating arrangement. Multiple word lines traverse through the active areas to form transistors. Multiple storage units are disposed between the word lines on the active areas in staggered array arrangement, and multiple bit lines electrically connect with all storage units on a corresponding active area, wherein each storage cell includes one of the storage unit, two of the transistors respectively at both sides of the storage unit, and two branches of the source line.

10 Claims, 3 Drawing Sheets

MEMORY LAYOUT STRUCTURE

BACKGROUND OF THE INVENTION

1. Field of the Invention

The present invention generally relates to a memory layout structure, and more specifically, to a memory layout structure with improved driving capability.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate magnetoresistive random access memory (MRAM) devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market.

Nevertheless, current MRAM still poses numerous shortcomings such as high write current requirement, high power consumption, low write speed, etc. It is necessary to improve the devices for solving these issues in the field.

SUMMARY OF THE INVENTION

In order to improve current magnetoresistive random access memory (MRAM), the present invention hereby provides a particular memory layout structure, characterized by achieving higher driving capability in the same cell size to improve worse memory driving capability in the field. It may also be applied in all kinds of new memories.

One aspect of present invention is to provide a memory layout structure, with multiple memory cells defined thereon. The memory layout structure includes a substrate with multiple active areas extending in a first direction, multiple source lines disposed between the active areas on the substrate and extending in the first direction, wherein each source line has multiple branches electrically and respectively connecting the active areas on both sides of the source line in alternating arrangement, multiple word lines disposed on the substrate and traversing through multiple active areas, wherein each word line and each active area traversed by the word line form a transistor, multiple storage units disposed between word lines on the active areas, wherein the storage units are disposed on the substrate in staggered array arrangement and electrically connecting the active areas, and multiple bit lines disposed on the storage units and extending in the first direction, wherein each bit line electrically connects all of the storage units on one corresponding active area, and each memory cell includes one of the storage unit, two of the transistors respectively on both sides of the storage unit and two branches of the source line.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
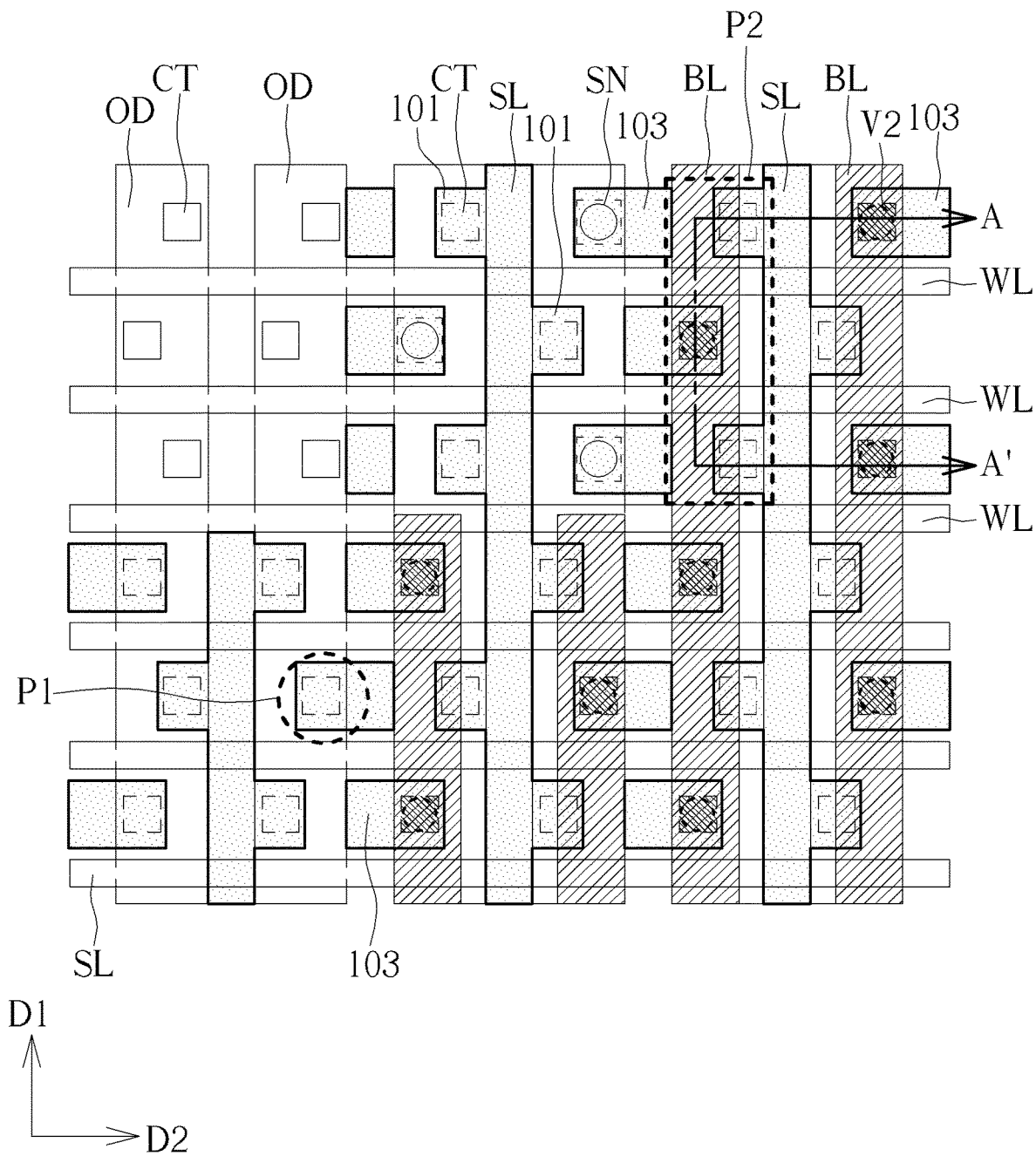
FIG. 1 is a memory layout in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

Please refer to FIG. 1, which is a memory layout in accordance with one embodiment of the present invention. The layout structure of present invention is designed on a substrate 100. As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer. In the embodiment of present invention, the substrate 100 is provided with multiple active areas OD spaced apart from each other and extending in a first direction D1. The active areas OD may be defined on the substrate 100 through oxidation and diffusion method. For example, in a condition that the substrate 100 is a silicon substrate, the active areas OD may be defined by forming oxide isolations such as shallow trench isolations (STI) and by doping/diffusion to form various sub-areas such as sources and drains on a substrate.

In the embodiment of present invention, multiple word lines are spaced apart from each other and extend in a second direction D2 through the active areas OD on the substrate 100. The second direction D2 is preferably perpendicular to the first direction D1. Each word line WL and each active area OD traversed therethrough form a transistor structure. The word line WL functions as a gate, and the active areas OD on both sides of the word line WL function as a source and a drain respectively.

Multiple source lines SL are disposed between the active areas OD and extend in the first direction D1. Please note that in the embodiment of present invention, source line SL is not always disposed between every active area OD. Instead, one source line SL is disposed between every two active areas OD. The source line SL may be a portion (referred hereinafter as first portion) of a first metal layer (M1), which is disposed to electrically connect a source of active area OD. Therefore, the source line SL is provided with branches 101 extending over and overlapping the active areas OD on both sides, wherein electrical connections may be established through contacts CT therebetween. In the embodiment of present invention, the branches 101 of source line SL is particularly in an alternating arrangement on both side of the source line SL and electrically connect the active areas OD on both sides. The active area OD connecting with the source line SL is source of the transistor. The branches 101 of source lines SL are formed between the word lines WL, and two adjacent branches 101 on a source line SL are separated by a word line WL and on opposite sides of the source line SL. Therefore, each source line SL would connect and function along with the active areas OD and the structures thereon on both sides.

In the embodiment of present invention, in addition to the source lines SL (i.e. the first portion), the first metal layer (M1) also includes second portion 103 disposed between the source lines SL. As it may be seen in FIG. 1, the second portion 103 of first metal layer (M1) consists of multiple blocks with the same size. These blocks are also disposed generally between every two active areas OD. Every block 103 is shifted toward one side and overlaps the active area OD, with electrical connection is established therebetween through a contact CT as shown in region P1. Similar to the branches of source line SL, adjacent block 103 in the same column would shift toward opposite sides respectively and electrically connect the active areas OD on both sides. The active area OD connecting with the block of second portion 103 is drain of the transistor, and as such it can be seen that one active area OD would be divided into multiple sources and drains by word lines WL in a source/drain/source/drain alternating arrangement. Source contacts and drain contacts on one active area OD would be disposed on both sides of the active area OD respectively.

In the embodiment of present invention, each storage unit SN is disposed on a corresponding block 103 of second portion in first metal layer (M1), i.e. on the active area OD and between the word lines WL. More particularly, through the aforementioned layout scheme, the storage units SN are disposed in a staggered array arrangement rather than a normal inline array arrangement on entire substrate 100. The storage unit SN is electrically connected with the active area OD through the second portion 103 of the first metal layer (M1) and a further underlying contact CT. In the embodiment of FIG. 1, the storage unit SN completely overlaps the underlying contact CT. The active area OD on which the storage unit SN is disposed is a drain, while the active areas OD separated by word lines WL on both sides are sources. In this way, it can be understood that in the embodiment of present invention, one storage unit SN would correspond to two channels and two sources, which is different from the design of one storage unit SN corresponding to one channel and one source in convention skill. This layout scheme may significantly increase the driving capability of memory. Also because of this scheme, it can be seen that two adjacent memory cells P2 on one active area OD would share one common source (and share one branch 101 of the source line SL).

In the embodiment of present invention, the storage unit SN is preferably on the level of second metal layer (M2). The storage unit SN electrically connects an overlying bit line BL through a via V2 above. The bit line BL is preferably a portion of a third metal layer (M3) spaced apart from each other and extending in the first direction D1. In FIG. 1, the storage unit SN completely overlap the via V2. Each bit line BL electrically connects all of the storage units SN on one corresponding active area OD. Similarly, one source line SL is disposed between every two bit lines. Please note that the third metal layer M3 further includes other portions in addition to the bit lines BL, such as the portions electrically connecting the branches 11 of source line SL. Nevertheless, for the clarity of drawings, those portions are not shown in FIG. 1.

Figure 3:
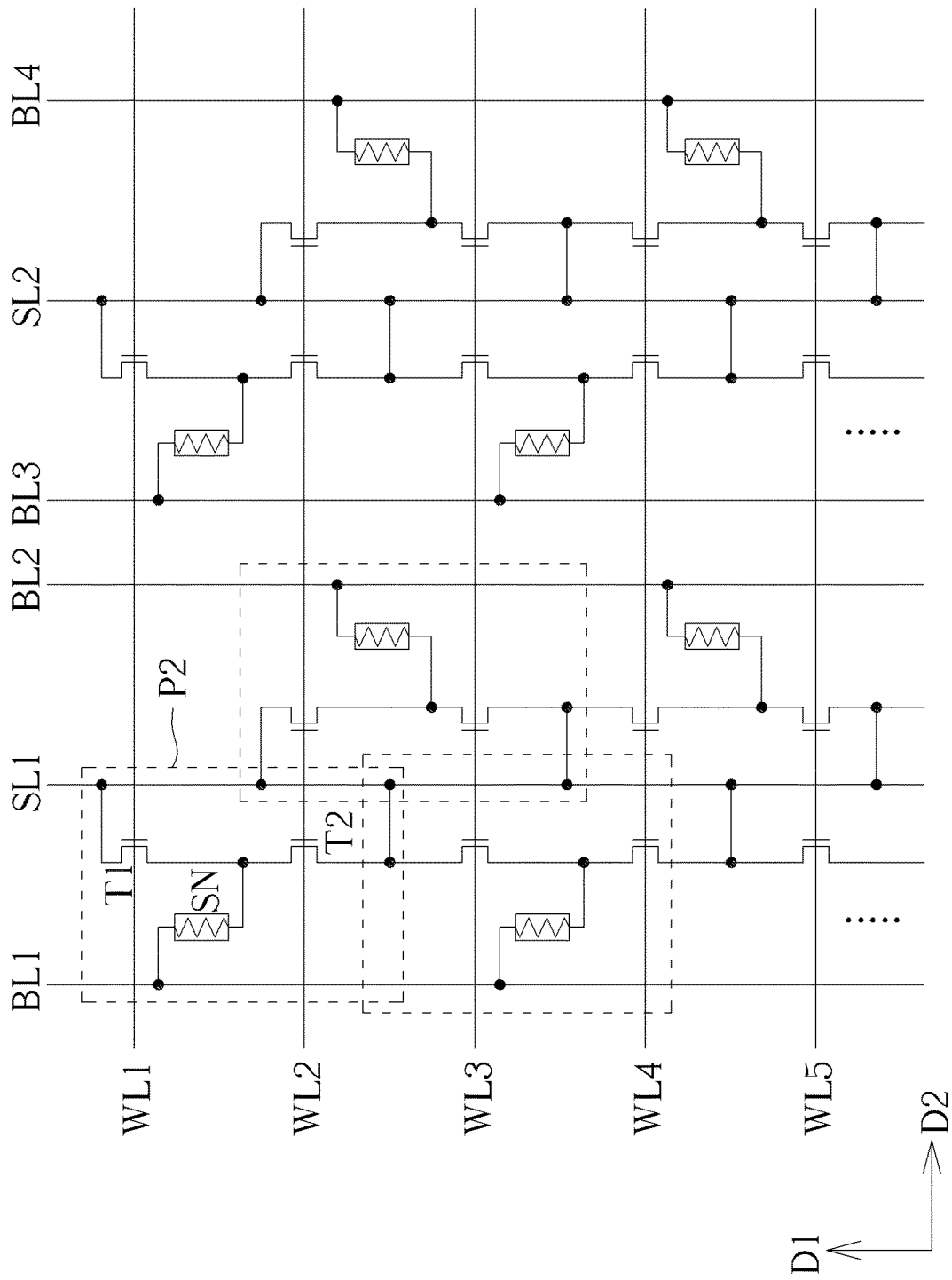
FIG. 3 is a memory circuit diagram in accordance with the embodiment of the present invention.

According to the aforementioned layout scheme as shown in FIG. 1, in the embodiment of present invention, each memory cell would include one storage unit SN, two transistors (i.e. word lines WL cooperating with active areas OD) respectively on both sides of the storage unit SN, and two branches 101 at the same side of one source line SL, as P2 shown in FIG. 3, and two adjacent memory cells P2 on the same column would share a branch 101 of source line SL. In addition to the aforementioned efficacy of increasing the driving capability of memory, this kind of asymmetric cell scheme may also significantly reduce necessary unit area, to achieve higher cell density and better driving capability in the same layout area.

Please note that in order to clearly show various layer structures in the layout, not all of layer components are shown in some portions of FIG. 1. For example, the upper-left portion of FIG. 1 only shows components such as active areas OD, word lines WL and underlying contacts CT. The lower-left portion show additional first metal layer (M1), including source lines SL and blocks of second portion 103. The upper-mid portion shows additional storage units SN, while other portions of FIG. 1 shows all of ever-mentioned components in the specification, including vias V2 and bit lines BL. In fact, entire layout structure should contain all of aforementioned components.

Figure 2:
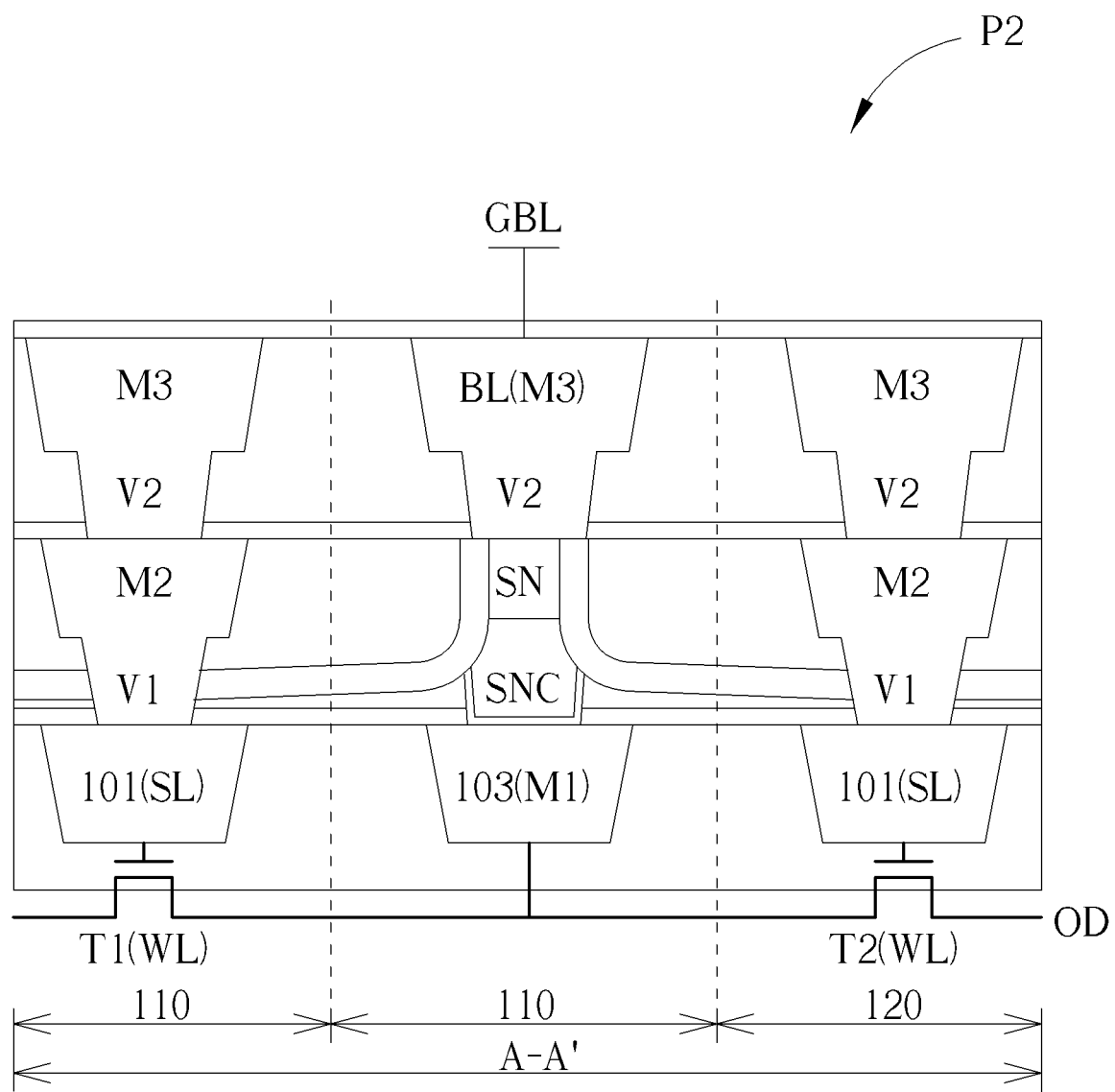
FIG. 2 is a schematic cross-section taken along the section line A-A' in FIG. 1 in accordance with the embodiment of the present invention.

Next, please refer to FIG. 2, which is a schematic cross-section taken along the section line A-A' in FIG. 1 in accordance with the embodiment of the present invention. It may provide a better understanding about the connection relation of one memory cell P2 in vertical orientation through FIG. 2. As it can be seen in FIG. 2, entire memory cell P2 is divided into storage array region 110 and logic regions 120 on both sides. Storage units SN are disposed in the level of second metal layer M2 on the storage array region 110 and are electrically connected with bit lines BL in the third metal layer M3 through vias V2 thereabove. The bit lines BL are further connected to a global bit line GBL. On the other hand, the storage units SN are electrically connected to the blocks of second portion 103 of the first metal layer (M1) through storage contacts SNC therebelow. The second portion 103 is further connected to the active areas OD of substrate through contacts. Regarding magnetoresistive random access memory (MRAM), the storage unit SN is magnetic tunnel junction (MTJ) stack structure, which may include the components like seed layer, fixed layer, reference layer, tunnel barrier layer, free layer, and top electrode and bottom electrode, etc. Nevertheless, please note that the embodiment of present invention may also be applied in the field of other new type memories, for example, phase change random access memory (PCRAM) or resistive random access memory (ReRAM). Only the structure and composition of storage unit SN would be different in these new type memories on the basis of the same circuit layout.

Refer again to FIG. 2. The storage array region 110 below storage unit SN and the logic regions 120 below the branches 101 of source line SL are in the same active area OD. That is, ON/OFF stats of the active area OD may be switched through transistor T1 and transistor T2 (controlled by word lines WL). The branches 101 of source line SL above the logic region 120 may be further connected to overlying second metal layer M2, third metal layer M3 and other peripheral circuit structures through vias V1 and vias V2. Nevertheless, since the second metal layer M2 and the third metal layer M3 are not key point of the present invention, these components are not shown in FIG. 1.

Please refer next to FIG. 3, which is a memory circuit diagram in accordance with the embodiment of the present invention. As shown in FIG. 3, the entire circuit structure is made up of multiple bit lines BL1-BL4 extending in the first direction D1 and multiple word lines WL1-WL5 extending in the second direction D2. One source line SL1 or SL2 is disposed between every two bit lines. The branches of source lines SL1, SL2 are connected to sources of transistors T1, T2 formed by the word lines WL1-WL5 and active areas. One end of storage unit SN is connected to the bit lines BL1-BL4, while the other end of the storage unit SN is connected to a common drain between the transistor T1 and the transistor T2. It can be seen in the figure that one memory cell P2 would include one storage unit SN, two transistors T1, T2, one bit line BL1-BL4 and one source line SL1-SL2. One source line SL1, SL2 would correspond to two memory cells P2 on both sides, i.e. the source line SL1-SL2 would be shared by the two memory cells P2 on both sides. Adjacent storage units SN in the same column would share one source.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory layout structure with multiple memory cells defined thereon, comprising:
    a substrate with multiple active areas extending in a first direction;
    multiple source lines disposed between said active areas on said substrate and extending in said first direction, wherein each said source line has multiple branches electrically and respectively connecting said active areas on both sides of said source line in alternating arrangement;
    multiple word lines disposed on said substrate and traversing through multiple said active areas, wherein each said word line and each said active area traversed by said word line forma transistor;
    multiple storage units disposed between said word lines on said active areas, wherein said storage units are disposed on said substrate in staggered array arrangement and electrically connecting said active areas; and
    multiple bit lines disposed on said storage units and extending in said first direction, wherein each said bit line electrically connects all of said storage units on one corresponding said active area;
    wherein each said memory cell comprises one said storage unit, two said transistors respectively on both sides of said storage unit and two said branches of said source line.

2. The memory layout structure of claim 1, wherein said source lines are first portion of a first metal layer (M1).

3. The memory layout structure of claim 2, wherein said first metal layer (M1) further comprises second portion disposed between said word lines and between said source lines under said storage units, and said storage units electrically connect said active areas through said second portion of said first metal layer (M1) and contacts.

4. The memory layout structure of claim 2, wherein said storage unit electrically connects said bit line through a via above.

5. The memory layout structure of claim 1, wherein said branch of said source line electrically connects said active area through a contact.

6. The memory layout structure of claim 1, wherein said branches of said source lines are between said word lines on said active areas, and two adjacent said branches on one said source line are separated by one said word line and on opposite sides of said source line.

7. The memory layout structure of claim 1, wherein every two said bit lines are disposed between two said source lines.

8. The memory layout structure of claim 1, wherein every two said memory cells share one said branch of said source line.

9. The memory layout structure of claim 1, wherein one said source line is disposed between every two said active areas.

10. The memory layout structure of claim 1, wherein said memory cell comprises magnetoresistive random access memory (MRAM), resistive random access memory (ReRAM) or phase change random access memory (PCRAM).

\* \* \* \* \*